United States Patent [19]
Lane et al.

[11] 4,047,114
[45] Sept. 6, 1977

[54] DIGITAL DETECTOR

[75] Inventors: Richard A. Lane, Huntsville, Ala.;
Donald K. Fronek, Sparks, Nev.

[73] Assignee: The United States of America as represented by the Secretary of the Army, Washington, D.C.

[21] Appl. No.: 712,427

[22] Filed: Aug. 6, 1976

[51] Int. Cl.² .............................................. H03K 9/06
[52] U.S. Cl. .................... 328/140; 328/138; 329/126
[58] Field of Search ............... 328/14, 138, 140; 307/233, 290; 329/126

[56] References Cited

U.S. PATENT DOCUMENTS

| | | | |
|---|---|---|---|
| 3,543,172 | 11/1970 | Seppeler | 328/140 X |
| 3,548,328 | 12/1970 | Breikss | 329/126 |
| 3,594,588 | 7/1971 | Evans et al. | 307/233 |
| 3,769,583 | 10/1973 | Spencer et al. | 328/140 X |
| 3,944,935 | 3/1976 | Plant | 328/140 |
| 3,999,136 | 12/1976 | O'Berry et al. | 328/138 |

Primary Examiner—John S. Heyman
Attorney, Agent, or Firm—Nathan Edelberg; Robert P. Gibson; Freddie M. Bush

[57] ABSTRACT

A digital detector which responds to sinusoidal or square wave input signals to detect the presence of a particular frequency or band of frequencies and provide a selectable digital output indicating the presence of this frequency or band. A gated pulse generator operates in response to the input signals, providing pulses that are counted by a binary counter and sensed by a decoder which detects the presence or absence of the frequencies within the selectable bandwidth limits.

5 Claims, 2 Drawing Figures

DIGITAL DETECTOR

DEDICATORY CLAUSE

The invention described herein may be manufactured, used, and licensed by or for the Government for governmental purposes without the payment to us of any royalties thereon.

SUMMARY OF THE INVENTION

A digital detector is responsive to a broad spectrum of input frequencies to detect the presence of a selectable frequency with specified band width. The input signal generates a gate signal that allows an internal oscillator to produce a pulse train which is counted in a binary coded decimal (BCD) counter and subsequently decoded to indicate presence or absence of the selectable frequency. The bandwidth logic and center frequency logic of the decoder may be adjusted across a broad frequency range, providing a versatile detector for frequency control or monitor circuits.

DESCRIPTION OF THE PREFERRED EMBODIMENT

Figure 1:
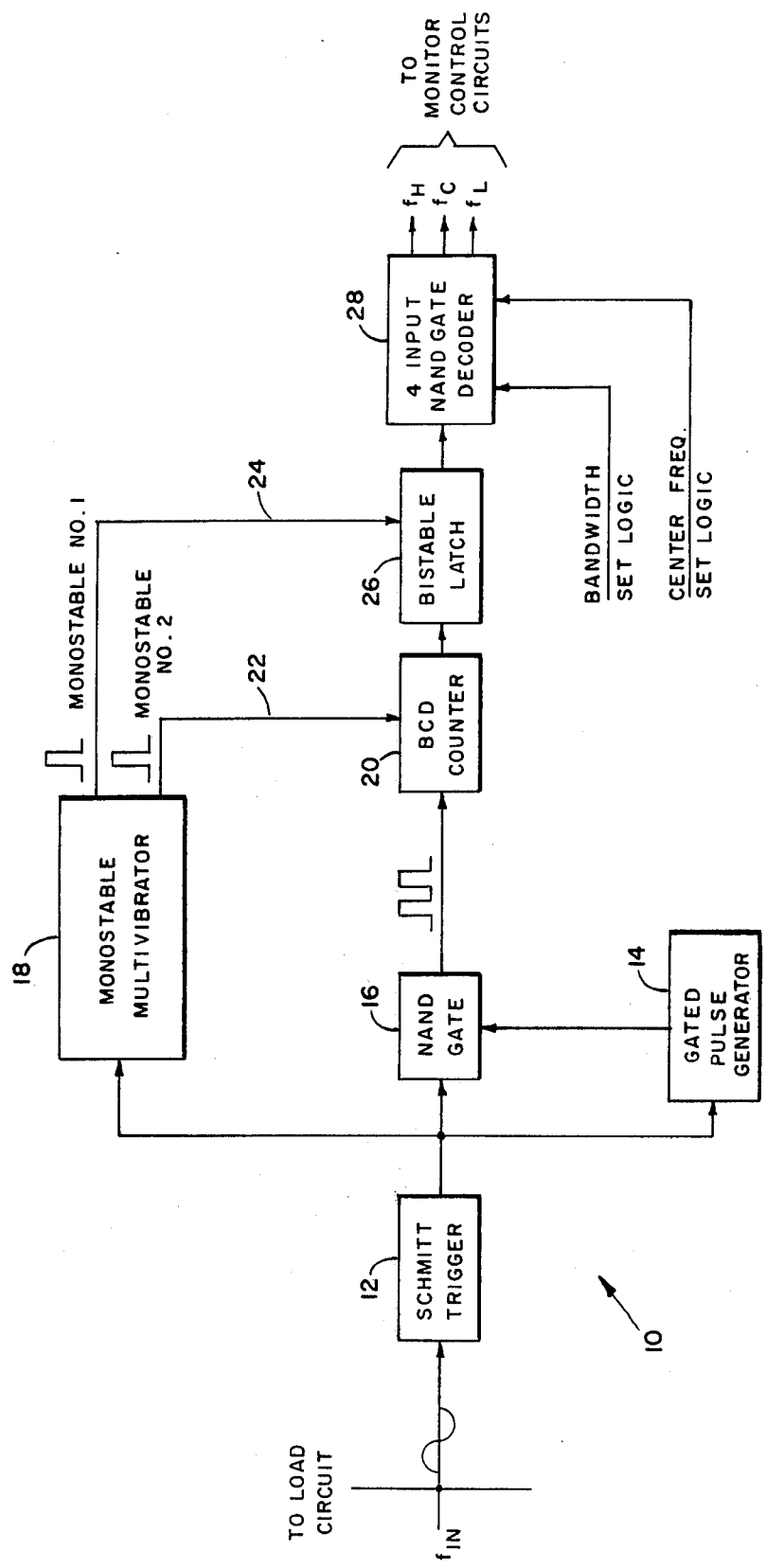
FIG. 1 is a block diagram of a preferred embodiment of the detector.

Referring now to the drawings, FIG. 1 is a preferred embodiment of the digital detector 10. A Schmitt trigger 12 is coupled to receive the input frequency spectrum and provide outputs to a gated pulse generator 14, a NAND gate 16, and a monostable multivibrator assembly 18. Pulse generator 14 has an output coupled to NAND gate 16 and provides known oscillator pulses thereto while gate 16 and generator 14 are periodically activated by the Schmitt trigger. A binary counter or binary coded decimal (BCD) counter 20 is coupled to receive an output from gate 16 and an output 22 from monostable multivibrator 18. Counter 20 provides an output to a bistable latch 26 and multivibrator 18 also provides an output 24 coupled to latch 26. Typically, latch 26 may be a flip-flop latching circuit. An output from latch 26 is coupled to a decoder 28. Decoder 28 has outputs which are indicative of the selected center frequency $f_c$ and other frequencies within the desired bandwidth as established by lower and upper limits $f_L$ and $f_H$. Decoder 28 may have the logic circuits selectable to provide bandwidth adjustment and center frequency adjustment in accordance with appropriate frequency range adjustments of other components such as the pulse generator 14. Schmitt trigger 12, or other shaping circuitry, provides a fast rise and fall time at logic levels.

Figure 2:
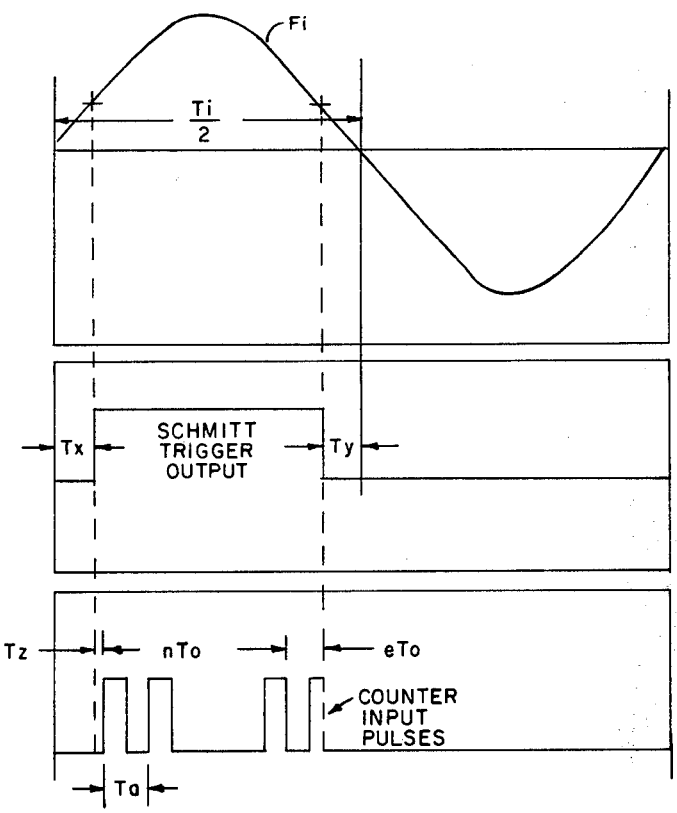
FIG. 2 is a waveform diagram showing the relationship between the composite input signal and the internal generated pulses responsive thereto.

As shown in FIG. 2 a sinusoidal input signal $F_i$ has a half-period of $T_i/2$. During the positive half cycle of the input signal the Schmitt trigger output occurs and provides the necessary timing for activating gate 16 and latching counter 20 when the gate falls at the end of the positive half period. $T_x$ and $T_y$ indicate the Schmitt trigger "on" and "off" delay, respectively. $T_z$ represents the oscillator start delay time. The number of full period counts of the gated pulse generator frequency which are detected by counter 20 is $nTo$. The proportional period, $eTo$, at the end of the gated period varies, depending on when the gating signal falls.

The gated pulse generator is a variable frequency oscillator that operates at a frequency determined by the particular center frequency to be detected. The output of this oscillator is generally a 50% duty cycle but may be altered if desired. The output from generator 14 is coupled through NAND gate 16 to counter 20. NAND gate 16 controls counter 20, allowing the oscillator pulses to pass only during the gating half period, $T_i/2$, while the Schmitt trigger output has gate 16 operable. BCD counter 20 is an n-bit counter having the capability of being latched and cleared from external control logic.

Dual monostable multivibrator circuit 18 is enabled when the input signal goes negative, providing an output signal at 24 which latches the output from counter 20 at bistable latching circuit 26 and an output signal at 22 which resets counter 20 in time sequence. The NAND gate and gated pulse generator are disabled during this time.

Decoder 28 is a multiple input gate such as a 4-input NAND gate which utilize standard Karnaugh map logic. Minimization is used to produce 2-level logic such as NAND-NAND, however, additional logic formats such as NOR-NOR, NOR-NAND, and NAND-NOR may be utilized.

During operation an input frequency range $f_i$, which includes $f_c$ or frequencies in the pass band $f_L$-$f_H$, is applied to a shaping circuit such as Schmitt trigger 12 for shaping. When the input signal goes positive NAND gate 16 and gated pulse generator 14 are enabled. As shown in FIG. 2, a series of pulses are generated and coupled from pulse generator 14, through gate 16 to BDC counter 20. These pulses are counted by the counter, latched in latching circuit 26 and coupled to decoder 28 for decoding. When the input signal goes negative, generator 14 and gate 16 are disabled and dual monostable circuit 18 is enabled providing two outputs which respectively latch the output from the counter and rest the BCD counter. If the input frequency does not change the output signal remains constant indicating presence of a frequency within the limits of band width. If the input frequency increases the gate period of the Schmitt trigger decreases and less internal oscillator pulses from generator 14 are counted. When the frequency decreases, the half-period $T_i/2$ increases and more oscillator pulses are counted. Since a predetermined or established count in counter 20 represents the center frequency $fc$ being monitored, any changes, up or down, in the input frequency result in a change in the oscillator pulse count coupled to counter 20. The changed count coupled to decoder 28 indicates the degree of shift up or down for each half cycle of input signal, which is directly representative of the actual input frequency that falls within the pass band of the detector.

The digital detector can be implemented in any system wherein it is desired to monitor a particular frequency, frequency shift, or band pass. For example it may be desirable to activate a control circuit to shut down a piece of equipment when the operating frequency exceeds the band pass limits. As shown, the system input is coupled to a line carrying the frequency $f_i$ to a load circuit. This may obviously be also received through other established means as in radio, radar, or power systems.

A circuit for providing a digital detector can be operated using typical componets such as:

| Schmitt trigger | Texas Instruments | SN7413 |
| Gate 16 | Texas Instruments | SN7400 |
| Generator 14 | Texas Instruments | SN74124 |
| Multivibrator 18 | Texas Instruments | SN74124 |
| Counter 20 | Texas Instruments | SN7493 |
| Latch 26 | Texas Instruments | SN7475 |
| Decoder 28 | Texas Instruments | SN7420 |

The decoder uses well known Karnaugh mapping logic in detecting the center frequency, with the center frequency and band width logic being preset into the decoder for the particular center frequency and band width desired. For example, using a 4-bit binary example and Karnaugh mapping, the pulse count to be detected may be defined as a function of A, B, C, D. The particular count 6 is uniquely specified by $\overline{A}BC\overline{D}$ where A = 0, B = 1, C = 1, and D = 0. The detection of such a single count specifies the center frequency. Karnough map cells to either side of the cell representing the center frequency represent the high and low band pass cells. The longer the band pass, the more implicit cells within the map. An implicit cell is a truth or logical 1 at a particular Karnaugh address.

It is not necessary to use a large n-bit counter in the detector, even though the internal oscillator is producing a pulse train which may fill the counter several times. Each time the counter fills and continues this gives rise to counting by harmonics. Since the decoder is detecting only the final count, higher order harmonics may be considered. For a given center frequency, $f_c$, the detector does not know if a fundamental or a multiple count is being detected, such as $2^N + X$ where N is the multiple count and X is the fundamental count. The harmonic relationship is important since the actual band pass is related to the number of adjacent cells in the Karnaugh map and the harmonic frequency.

Obviously many modifications and variations of the present invention are possible. For example, high frequency operation requires that $f_i$ and $f_o$ be interchanged. Thus, when the input signal frequency exceeds the oscillator frequency the roles are reversed while the same results are obtained. It is to be understood therefore that within the scope of the appended claims the invention may be practiced otherwise than as specifically described.

We claim:

1. A digital detector for detecting the presence of selected frequencies in an input signal comprising: counting means having an input and an output; a NAND gate having first and second inputs and an output, said output being coupled to said counting means input; shaping means having an input for receiving said input frequency signals and an output for providing a shaped gating pulse, the output of said shaping means being coupled to the first input of said NAND gate; a pulse generator having an output coupled to said second NAND gate input and having a gating input coupled to said shaping means output; and a decoder circuit coupled to said counter output for responding to said counter output to provide output pulses as a function of said detector input frequencies.

2. A digital detector as set forth in claim 1 wherein said counter is a binary counter and said shaping means is a Schmitt trigger.

3. A digital detector as set forth in claim 2 and further comprising a bistable latch coupled between said counter output and said decoder input, and wherein said decoder is a multiple-input NAND gate.

4. A digital detector as set forth in claim 3 and further comprising a monostable multivibrator having an input coupled to the output of said Schmitt trigger and first and second outputs coupled respectively as inputs to said counter and said latch for clearing said counter and switching said latch.

5. A digital detector as set forth in claim 4 wherein said pulse generator is an oscillator and said bistable latch is a flip-flop latching circuit.

* * * * *